United States Patent [19]

Mlavsky

[11] 4,036,666
[45] July 19, 1977

[54] MANUFACTURE OF SEMICONDUCTOR RIBBON

[75] Inventor: Abraham I. Mlavsky, Lincoln, Mass.

[73] Assignee: Mobil Tyco Solar Energy Corporation, Waltham, Mass.

[21] Appl. No.: 638,187

[22] Filed: Dec. 5, 1975

[51] Int. Cl.² .................. H01L 21/208; H01L 21/302; B01J 17/18

[52] U.S. Cl. .................. 148/1.5; 23/273 SP; 29/572; 29/580; 29/583; 136/89 SG; 148/171; 156/608; 156/619; 264/145; 264/146; 264/150; 156/617 R; 156/654; 156/662

[58] Field of Search .......... 148/1.5, 171, 186, 189; 156/17, 608, 617, 619; 23/273 SP; 29/572, 580, 583; 136/89; 83/54; 264/145, 146, 149, 150, 1

[56] References Cited

U.S. PATENT DOCUMENTS

| 3,129,061 | 4/1964 | Dermatis et al. | 156/619 X |
|---|---|---|---|
| 3,421,946 | 1/1969 | Shaikh et al. | 136/89 |
| 3,433,677 | 3/1969 | Robinson | 136/89 |
| 3,486,953 | 12/1969 | Ing et al. | 156/17 |
| 3,591,348 | 7/1971 | LaBelle | 23/273 SP |
| 3,686,036 | 8/1972 | Gereth et al. | 136/89 |
| 3,811,954 | 5/1974 | Lindmayer | 136/89 |
| 3,853,489 | 10/1974 | Bailey | 156/608 |

OTHER PUBLICATIONS

LaBelle, Jr.; H. E., "Growth of Controlled Profile Crystals—EFG" Mat. Res. Bull., vol. 6, No. 7, 1971, pp. 581-590.

Primary Examiner—L. Dewayne Rutledge
Assistant Examiner—W. G. Saba
Attorney, Agent, or Firm—Schiller & Pandiscio

[57] ABSTRACT

A method is provided for producing flat substantially monocrystalline ribbons, e.g. silicon ribbons for use in making flat solar cells. The ribbons are produced by growing substantially monocrystalline flat hollow tubes, and then excising the edge portions of the tubes so that the flat sides of the tubes form discrete ribbons.

12 Claims, 5 Drawing Figures

U.S. Patent July 19, 1977 4,036,666
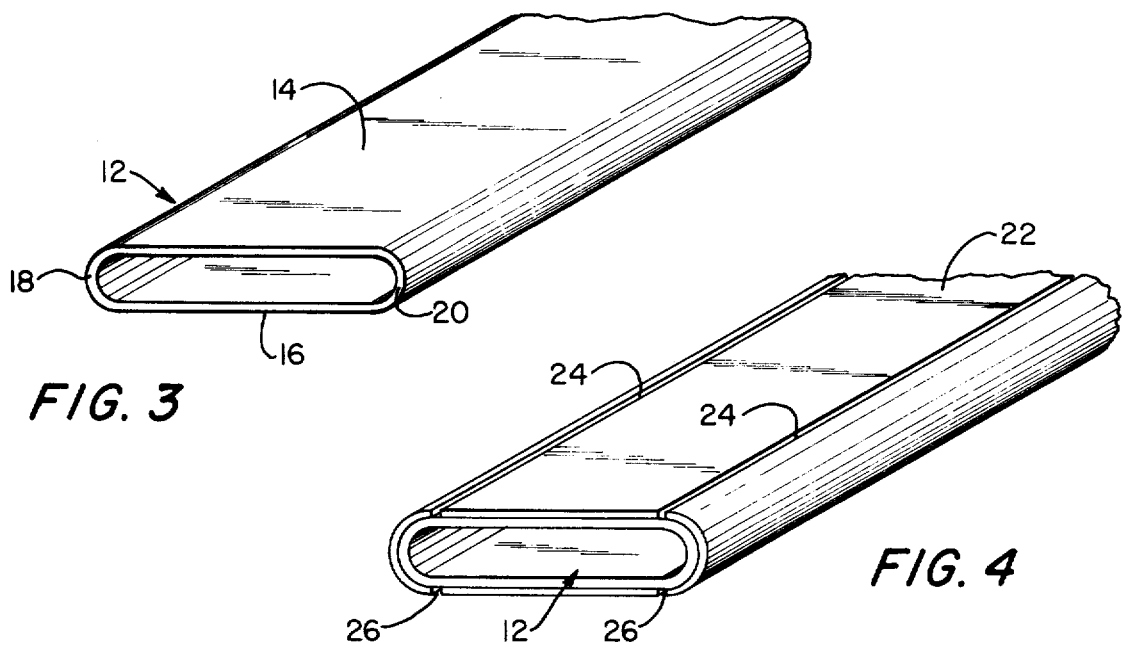
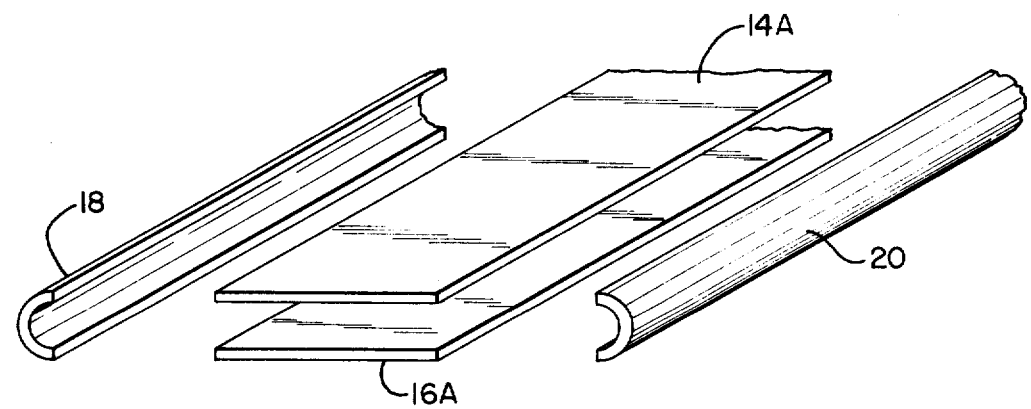
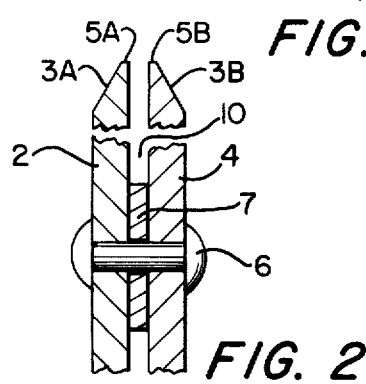
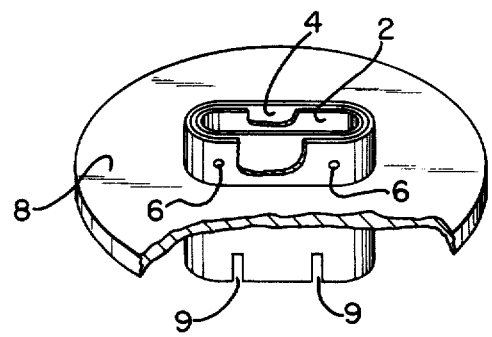

MANUFACTURE OF SEMICONDUCTOR RIBBON

The present invention relates to crystal growth and the fabrication of substantially monocrystalline ribbons of a semiconductor material for use in forming solar cells and other solid state devices.

The technology of fabricating solid state electronic devices characterized by flat surfaces is well developed and hence the fabrication of solar cells or other devices using substantially momocrystalline flat ribbon of silicon or other semiconductor material is easily accomplished. It also is known that thin ribbons of silicon or other materials may be grown by the process disclosed in U.S. Pat. No. 3,591,348 issued to Harold E. LaBelle, Jr. (this process is frequently described as the "EFG" process where the term "EFG" is an abbreviation for "Edge-defined, film-fed growth"). By such process it is possible to grow substantially monocrystalline bodies of silicon or other material in diverse shapes of controlled dimensions, e.g. round rods, tubes, and flat ribbons, by means of so-called capillary die members which employ capillary action for replenishing the melt consumed by crystal growth. Silicon bodies of selected cross-sectional configuration can be readily produced by the EFG process using die members made of graphite or graphite coated with silicon carbide (see T.F. Ciszek, Edge-Defined, Film-Fed Growth of Silicon Ribbons, Mat. Res. Bull., Vol. 7, pp. 731–738, 1972). It is also known that said U.S. Pat. No. 3,591,348 and also U.S. Pat. No. 3,687,633, issued Aug. 29, 1972 to Harold E. LaBelle, Jr. et al., illustrate forms of EFG dies that may be used to produce hollow tubes and flat ribbons. By controlling the growth environment and using a semiconductor grade silicon melt, it is possible to grow substantially monocrystalline tubes or ribbons of silicon with a purity and electronic properties suitable for semiconductor device purposes. Also, by introducing suitable conductivity-type-determining impurities, i.e., dopants, to the melt it is possible to produce bodies by the aforesaid EFG process which have a P-or N-type conductivity and a predetermined resistivity. The addition of a dopant to a melt from which a crystal is grown is conventional, for example, with Czochralski-type processes and also is exemplified by U.S. Pat. Nos. 3,129,061 and 3,394,994.

Use of the EFG process to produce silicon ribbon for the manufacture of flat solar cells is appealing since it is possible to produce ribbon of controlled cross-sectional dimensions and shape and indefinite length at a relatively high growth rate, and also to grow several ribbons simultaneously in the same crystal growing furnace using several dies in a single crucible. However, one problem which exists with respect to EFG ribbons consists of the formation or occurrence of defects adjacent the edges of the ribbon. Although not known for certain, it is believed that such edge defects result from the shape of the meniscus or the solid-liquid interface at the ribbon edges and/or accumulation at or adjacent the ribbon edges of impurities present in the melt. These edge defects are objectionable and in many instances the ribbons must be processed further to remove the defects before they can be used.

Accordingly, the primary object of this invention is to provide a method of producing ribbons of improved quality using the EFG process.

A further object is to provide a relatively inexpensive and simple method of producing substantially monocrystalline ribbons of selected materials such as silicon for use in fabricating solar cells or other electronic devices.

Still another object is to facilitate manufacture of solar cells by providing a method of producing silicon ribbon using the EFG process whereby the ribbon has less edge defects than ribbon heretofore grown by EFG.

The foregoing and other objects are achieved by a manufacturing method which basically comprises first producing a substantially monocrystalline tubular body of silicon or other suitable semiconductor material which has the shape of a flat oval in cross-section, and excising the curved edge sections so as to form two flat ribbons. In practicing the invention in connection with the manufacture of silicon solar cells, the photoactive rectifying junctions which characterize the cells may be formed by suitably processing the tubular bodies or the ribbons produced by severing them. Other features and many of the attendant advantages of this invention are set forth in or rendered obvious by the following detailed description which is to be considered together with the accompanying drawings wherein:

FIG. 1 is a perspective view of one form of EFG die assembly that may be used to form flat tubular bodies as required by this invention;

FIG. 2 is an enlarged fragmentary sectional view of the same die assembly;

FIG. 3 is a perspective view of a portion of a flat silicon tube provided in accordance with this invention;

FIG. 4 is a perspective view of the tube of FIG. 3 coated with a resist material preparatory to its being sub-divided; and FIG. 5 is a perspective exploded view showing the severed parts resulting from sub-dividing the tube of FIG. 3 in accordance with this invention.

In the several views of the drawing, like numerals refer to like parts.

Since a tubular body is continuous in cross-section, it has no edge regions comparable to the longitudinal side edges of a ribbon. Accordingly, tubular bodies do not have the edge surface defects as normally found in flat ribbons or other shapes having two or more defined side edges. More precisely, a tubular body grown by the EFG process has better crystallinity than ribbons grown by the same EFG process under the same conditions. In addition, the absence of edges leads to better stability during growth, permitting greater growth flexibility and hence quality of the crystals. Furthermore, high quality silicon tubes of circular cross-section can be grown at rates as high as 3 inches/minute while high quality silicon ribbon generally is required to be grown at about 1½ inches/minute. Tubes with a flat oval cross-sectional shape can be grown at the same speed as cylindrical tubes.

Accordingly, the essence of this invention is to produce flat or nearly flat semiconductor ribbons for use in making solid state electronic devices by first growing a substantially monocrystalline tube having a flat oval cross-section and then slicing the tube lengthwise to remove the curved side sections and thereby produce two discrete ribbons which may be used to form the devices. While the invention may be used to provide ribbons of different materials, e.g., sapphire ribbons for use as substrates for integrated circuit devices, the following description illustrates applications of the invention to production of silicon ribbons for use in the manufacture of solar cells or other solid state devices.

In the preferred mode of practicing the invention, a flat oval tube of a first type conductivity is provided initially, and such tube is then cut to excise the curved side sections and thereby produce two flat ribbons. These ribbons then may be processed to form solar cells or other devices. By way of example, each ribbon may be treated to provide a zone of a second opposite type conductivity with a photovoltaic rectifying junction created at the interface of such zone and a zone of the first type conductivity, after which electrodes are applied to the opposite broad surfaces of the ribbon to form a solar cell. In an alternative mode of practicing the invention, a flat oval semiconductor tube is provided which is not predominantly of P or N type conductivity. This tube is then cut so as to yield two ribbons, and then the ribbons are used to form a solar cell or other electronic device. By way of example, each of the ribbons may be treated so as to sequentially form contiguous zones of P-type and N-type conductivity which provide a P-N junction that is disposed so as to be capable of photovoltaic behavior in response to solar radiation impinging upon a selected surface of the ribbon. Of course the ribbons also may be used to form Schottky barrier devices.

Treating the ribbon so as to create zones of P and/or N type conductivity may be accomplished in various ways known to persons skilled in the art, e.g., by diffusion or ion implantation of dopants or by epitaxial deposition of selected conductivity material. The type of dopant used depends on the material of which the flat oval tubes are composed and also its conductivity type. Thus, for example, boron may be diffused into N-type silicon to produce a zone of P-type conductivity while phosphorous may be diffused into P-type silicon to produce a zone of N-type conductivity. The several types of dopants used for modifying the conductivity of silicon and how such conductivity-modifying impurities may be diffused into a silicon body are well known (see, for example, U.S. Pat. Nos. 3,162,507; 3,811,954; 3,089,070; 3,015,590; and 3,546,542). The types of dopants required to modify the conductivity type of other materials, e.g. gallium arsenide, cadmium telluride, etc., also are well known to persons skilled in the art. In accordance with prior art knowledge, the concentration of dopants is controlled to obtain the desired resistivity of the P- and N-type regions. For example, for silicon solar cells the resistivity of such regions is held to less than about 100 ohm-cm and for best conversion efficiency it ranges between about 0.001 to about 10 ohm-cm; also in order to improve the efficiency of collecting the photoelectrctrically produced carriers, the depth of the P-N junction from the surface which is to serve as the radiation receiving surface, is made small, preferably in the order of ½ micron.

Severing the flat oval tubes to obtain the flat ribbons may be accomplished mechanically by cutting them with a suitable diamond cutter. However, mechanically cutting silicon tubes is not preferred since they have a relatively low resistance to impact because of their crystallinity and relatively thin walls. Accordingly, the preferred mode of excising the curved side sections of the flat oval silicon tube is by etch-cutting the tubes. Tubes of other materials, e.g. sapphire, also may be etch cut.

An example of the preferred mode of practicing the invention will now be described with reference to FIGS. 1–5. While the preferred mode is described in connection with the manufacture of substantially monocrystalline ribbons of silicon, it is to be understood that the invention also may be used to produce ribbons of other semiconductor materials, e.g. germanium, or materials used for other purposes, e.g. sapphire ribbons for use as substrates for silicon-on-sapphire integrated circuit devices.

Turning first to FIG. 1, there is illustrated an EFG capillary die assembly which comprises two flat oval graphite sleeves 2 and 4 disposed concentrically one inside the other and pinned together by a plurality of transversely extending graphite pins 6. Each pin 6 extends through a graphite spacer 7 which serves to maintain the sleeves aligned with a uniform gap 10 between them. The outer sleeve 4 extends through and is attached to a circular plate 8 which is used to mount the die assembly to a crucible in the manner illustrated by LaBelle et al. U.S. Pat. No. 3,687,633. The upper ends of sleeves 2 and 4 are bevelled on the inside and outside respectively as shown at 3A and 3B so as to terminate in flat narrow surfaces 5A and 5B respectively, and the gap 10 between the two sleeves is sized so that it can function as a capillary for silicon. One or more slots 9 in the bottom ends of each of the sleeves 2 and 4 assures that melt can flow into the bottom end of the capillary.

Turning now to FIG. 3, a flat oval tube 12 of substantially monocrystalline P-type silicon is provided by growing it from a boron-doped, semiconductor grade silicon melt under an inert atmosphere of argon gas using the above described EFG process and a graphite die assembly as shown in FIG. 1. The tube is grown in a furnace of the type disclosed by U.S. Pat. No. 3,591,348. A quartz crucible is used to contain the silicon melt and the graphite die assembly is mounted in the crucible in the manner illustrated in said U.S. Pat. No. 3,687,633 so that the silicon melt can enter the bottom end of the capillary and rise to its upper end by capillary action. A silicon seed crystal is used to initiate crystal growth. The sleeves of the die each have a thickness of about 0.040 inch but the corresponding dimension of each of their upper surfaces 5A and 5B is about 0.005 inch while the width of the oval shaped gap 10 between them which serves as the capillary is about 0.015 inch. The tube is grown at a pulling speed of about 2.5 inches per minute. The liquid between the upper end surfaces of the die and the growing solid has a height of about 0.020 inch and at its bottom end its inside and outside dimensions are substantially the same as the corresponding inside and outside dimensions of end surfaces 5A and 5B respectively. However, the width of the liquid is smaller at the liquid/solid interface, as manifested by the fact that the resulting tube 12 has a wall thickness of about 0.006 inch. A more detailed description of the crystal growing process is not believed to be necessary for the purposes of this description since the EFG process and growth of silicon bodies by such process is known to persons skilled in the art, as exemplified by the paper published by T.F. Ciszek, supra.

The tubular body 12 which is provided is characterized by substantially flat opposite side wall sections 14 and 16 of substantially uniform thickness and curved, preferably semicylindrical, opposite side edge sections 18 and 20. For convenience of illustration, the wall thickness of tube 12 and the gap between wall sections 14 and 16 are shown as being relatively large in relation to the width of the wall sections. By way of example, in the manufacture of silicon ribbons for use in making flat solar cells, the tube 12 may be made with a wall thickness of 0.005–0.010 inch, an overall width (the horizontal dimension in FIG. 3) of about 2 inches, and a gap between the flat side wall sections 14 and 16 of about 0.30 inch. However, the tubes may be made in other cross-sectional sizes.

Referring now to FIGS. 3, 4 and 5, cutting of the tube 12 so as to excise the side edge sections 18 and 20 and leave two discrete ribbons 14A and 16A is accomplished by coating the outer surface of the tube with a conventional polymethylmethacrylate positive resist material as represented at 22. Then the portions of the resist layer 22 covering the broad side wall sections 14 and 16 are exposed to a narrow beam of light so that at each side wall section two straight and narrow longitudinally extending areas of the resist coating are exposed and thereby altered to a different molecular weight polymer. The tube is then immersed in a preferential solvent or etchant such as methyl isobutyl ketone with the result that the unexposed portions of resist coating 22 remain intact while the exposed areas are dissolved away to expose two narrow line portions of each of the side wall sections 14 and 16 as illustrated at 24 and 26 respectively. Preferably, but not necessarily, the two exposed areas 24 are aligned with the corresponding areas 26 so that the resulting ribbons will have substantially the same width. The next step involves applying a silicon etchant to the tube so as to subdivide it along its exposed areas 24 and 26. This is achieved by applying KOH to the exposed areas 24 and 26 at room temperature for about 10 minutes this time being determined by the tube thickness (or in a mixture of one part HF and three parts $HNO_3$), whereby the silicon tube is etched through to separate the side edge sections 18 and 20 from the side wall sections 14 and 16. This excision of the side edge section is followed by rinsing the resulting ribbons 14A and 16A with distilled water and then dissolving away the resist coating 22 with a suitable solvent such as trichloroethylene. Thereafter the ribbons may be used to form solar cells.

Solar cell formation is achieved by introducing the ribbons 14A and 16A into a diffusion furnace where they are exposed to a gaseous mixture of oxygen and phosphorous oxychloride at a temperature of about 900° C for a period of about 15 to 30 minutes. As a consequence of this step, phosphorous is diffused into the sides of the flat ribbons so as to form an N-P-N structure with a relatively shallow N region or zone at each side having a depth of about 0.5 microns and a thin (about 3000A) silicon dioxide layer covering both broad sides of each ribbon. The formation of the diffusion oxide layer results from the presence of oxygen which is used as the transport medium for the phosphorous oxychloride. Thereafter each ribbon is coated along its four edges and one of its two broad sides with the same positive resist material and then the ribbons are immersed first in HF for 1-2 minutes and then in KOH (or a mixture of $HNO_3$) for about the same amount of time. These immersion steps remove the oxide layer and the N conductivity region on the exposed side of each ribbon. Then trichloroethylene is applied to each ribbon to dissolve away the resist coating and it is again immersed in HF at room temperature long enough (about 2-3 minutes) to remove the oxide layer but not the other N-conductivity region on the other side of the ribbon.

The final step required to make a solar cell is to apply electrodes to the opposite sides of ribbon. The electrodes are formed by a conventional metalization technique. The electrodes may be nickel applied by electroless plating. Alternatively the electrodes may be laminates formed by evaporation deposition and comprise a layer of aluminum attached to the ribbon and a layer of silver bonded to the aluminum. Other electrode materials and electrode formation and application techniques known to persons skilled in the art may be used. The electrode on the P-conductivity side of the ribbon preferably is uninterrupted and covers the entire expanse of that side surface; however, the electrode on the opposite side of the silicon ribbon overlying the N conductivity region is formed as a grid (in the manner disclosed by U.S. Pat. Nos. 3,686,036 and 3,811,954) so that a major portion of that surface is uncovered and thus exposed to receive solar radiation. The resulting structure is a solar cell with a substantially planar N-P junction that lies close to the upper surface of the cell and electrodes for coupling the cell into an electrical circuit.

As an alternative to the above-described excising procedure, both the inner and outer surfaces of the silicon tube 12 may be coated with a resist material, the resist on the outer surface may be exposed and developed so as to expose the areas 24 and 26 as above-described, and then the tube cut by immersing it in a bath consisting of KOH (or a mixture of one part HF and three parts $HNO_3$) for about 10 minutes, whereby the tube is etch cut to provide precise width ribbons as shown at 14A and 16A. Depending upon the tensile strength of the inner resist layer and its adherence to the tube, the side wall and edge sections may or may not detach themselves from that layer when the etchant has dissolved through the full wall thickness of the tube. In any event, the etch cut sections of the tube are removed from the etchant bath and trichloroethylene is applied to dissolve away the resist layer. Thereafter the procedure previously described may be used to form solar cells.

It also is contemplated that the tube 12 may be treated before it is severed to form an N-P junction near its outer surface. This may be accomplished in various ways known to persons skilled in the art, e.g. by ion implantation or diffusion of dopants or by epitaxial deposition of opposite type conductivity material. If an N-P-N or P-N-P structure results (as where diffusion doping is practiced) the ribbons formed by cutting the tubes must be etched to remove the superfluous N or P type region photovoltaic junction. Otherwise the ribbons need only be treated to apply the electrodes and assure that they form ohmic contacts with the ribbons.

It is to be appreciated that if the tubular bodies are grown to a suitable cross-sectional size, each of their flat sides 14 and 16 may be sliced longitudinally so as to form two or more ribbons. By way of example, if the tube 12 were to be made so that its side wall sections 14 and 16 were two inches wide, it could be severed longitudinally so as to provide four ribbons each with a width of almost one inch. Of course, each of the ribbons 14A and 16A (or the tube 12) could be cut transversely so as to provide a number of shorter length ribbons.

It is to be understood also that the side sections 14 and 16 need not be exactly flat but either or both of the outer and inner surfaces of each such section could have a concave or convex shape, provided, however, that where both surfaces are curved the curvature must be sufficiently gentle for the ribbons to be useful for their intended purposes. By way of example, the outer surface of each section 14 and 16 could be convex while the inner surface could be flat or have the same curvature as the outer surface. Preferably, however, the cross-sectional shape of at least one of the inner and outer surfaces of the tube should be generally that of a flattened circular ring. Accordingly, the term "flat oval" is to be construed as embracing a generally rectangular shape with rounded rather than sharp corners and also flattened elliptical shapes, i.e. ellipses characterized by a relatively short vertical axis and a relatively long horizontal axis and ellipses where portions thereof on opposite sides of the longer axis are flat or nearly so. Similarly the term "substantially flat" as applied to the side wall sections of the hollow tube or a surface thereof is to be construed as including a gently curved as well as a flat section or surface.

Of course, the invention may be practiced by using N-type silicon tubes and introducing a P-type layer or zone to the tube or to the formed ribbons so as to provide a P-N junction. Obviously, in the case of sapphire (α-alumina) ribbons to be used as substrates for silicon integrated circuit devices, no doping of the ribbons is required. Still other modifications and advantages will be obvious to persons skilled in the art.

It is to be understood also that the term "substantially monocrystalline" as used herein is intended to embrace a crystalline body that is comprised of a single crystal or two or more crystals, e.g. a bicrystal or tricrystal, growing together longitudinally but separated by a relatively small angle (i.e. less than about 4°) grain boundary.

What is claimed is:

1. A method of producing substantially monocrystalline ribbons for use in fabricating solid state electronic devices comprising the steps of:
    a. providing a substantially monocrystalline body of a semiconductor material in the form of a flat oval tube having a pair of opposed mutually spaced substantially flat side wall sections connected together by a pair of opposed side edge sections; and
    b. severing said opposed side edge sections from said tube so that said side wall sections are separated as discrete ribbons.

2. Method according to claim 1 wherein said tube is made of silicon.

3. Method according to claim 1 wherein said tube is made of α-alumina.

4. Method according to claim 1 wherein said tube comprises P-type silicon.

5. Method according to claim 1 wherein said tube comprises N-type silicon.

6. Method according to claim 1 wherein said tube is severed by dissolving selected portions thereof with a liquid solvent.

7. Method according to claim 1 wherein said tube is severed by etching away selected portions thereof with a selected etchant.

8. Method according to claim 7 including the step of coating selected areas of said tube with a material that is resistant to said etchant, so that said predetermined areas are protected against attack by said etchant.

9. Method according to claim 1 including the steps of forming a protective film on the surfaces of said tube, removing selected portions of said film, and severing said tube by etching it where the selected portions of said film were removed.

10. Method according to claim 1 wherein said tube is characterized by a first type conductivity, and forming a zone of opposite type conductivity at the outer surface of said tube before it is severed.

11. Method according to claim 1 wherein said tube is characterized by a first type conductivity, and treating at least one of said ribbons to form a zone of opposite type conductivity and a photovoltaic junction near one surface of said ribbon.

12. Method according to claim 11 including the step of forming electrodes on two surfaces of said at least one ribbon on opposite sides of said junction.

* * * * *